United States Patent
Tomisawa et al.

(10) Patent No.: US 10,985,719 B2
(45) Date of Patent: Apr. 20, 2021

(54) ELECTRONIC MODULE AND POWER MODULE

(71) Applicant: Mitsubishi Electric Corporation, Chiyoda-ku (JP)

(72) Inventors: Jun Tomisawa, Chiyoda-ku (JP); Akinori Nishizawa, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 122 days.

(21) Appl. No.: 16/480,738

(22) PCT Filed: Nov. 8, 2017

(86) PCT No.: PCT/JP2017/040243
§ 371 (c)(1),
(2) Date: Jul. 25, 2019

(87) PCT Pub. No.: WO2018/163507
PCT Pub. Date: Sep. 13, 2018

(65) Prior Publication Data
US 2020/0274505 A1     Aug. 27, 2020

(30) Foreign Application Priority Data
Mar. 9, 2017    (JP) .............................. JP2017-044564

(51) Int. Cl.
*H02H 1/00*     (2006.01)
*H02H 7/20*     (2006.01)
(Continued)

(52) U.S. Cl.
CPC ....... *H03F 3/45475* (2013.01); *H02H 1/0007* (2013.01); *H02H 7/20* (2013.01);
(Continued)

(58) Field of Classification Search
CPC .... H03F 3/45475; H02H 1/0007; H02H 7/20; H05K 1/0204; H05K 1/181;
(Continued)

(56) References Cited

U.S. PATENT DOCUMENTS 5,565,658 A * 10/1996 Gerpheide .............. G06F 3/041
                                                        178/18.02
2013/0271426 A1   10/2013 Yumoto et al.
2014/0061821 A1   3/2014 Kawano et al.

FOREIGN PATENT DOCUMENTS

JP    2013-246557 A    12/2013
JP    2014-53344 A     3/2014
JP    2015-64899 A     4/2015

OTHER PUBLICATIONS

International Search Report dated Jan. 16, 2018 in PCT/JP2017/040243 filed Nov. 8, 2017.

* cited by examiner

*Primary Examiner* — Toan T Vu
(74) *Attorney, Agent, or Firm* — Xsensus LLP

(57) ABSTRACT

Peeling in an electronic module is sensed. An electronic module according to the present invention includes a specified conductor, an insulating layer, a wiring layer, and a capacitance-to-voltage converter. The wiring layer includes a sense electrode. The capacitance-to-voltage converter is connected to the sense electrode. The sense electrode is opposed to a portion of the specified conductor via the insulating layer, and forms a capacitance with the portion. The capacitance-to-voltage converter is configured to output a voltage according to the capacitance.

6 Claims, 12 Drawing Sheets

(51) Int. Cl.
*H03F 3/45* (2006.01)
*H05K 1/02* (2006.01)
*H05K 1/18* (2006.01)

(52) U.S. Cl.
CPC ........... *H05K 1/0204* (2013.01); *H05K 1/181* (2013.01); *H05K 2201/066* (2013.01); *H05K 2201/10007* (2013.01)

(58) Field of Classification Search
CPC .... H05K 2201/066; H05K 2201/10007; H01L 23/36; H01L 23/3735; H01L 23/642; H01L 2924/35121; H01L 2924/3512; H01L 23/62; H01L 23/485
USPC .......................................................... 307/116
See application file for complete search history.

ELECTRONIC MODULE AND POWER MODULE

TECHNICAL FIELD

The present invention relates to an electronic module and a power module, each having a failure sensing function.

BACKGROUND ART

Conventionally, peeling of a layer is known to occur in a stack structure included in electronic modules. For example, Japanese Patent Laying-Open No. 2014-53344 (PTL 1) discloses that a die pad peels from a semiconductor chip with repetition of temperature rise and fall (temperature cycling).

CITATION LIST

Patent Literature

PTL 1: Japanese Patent Laying-Open No. 2014-53344

SUMMARY OF INVENTION

Technical Problem

Like power modules, some of electronic modules handle large power. Therefore, electronic modules may significantly generate heat when they are in use. As a layer is peeling, conduction of heat is disturbed at the peeled portion of the layer. The heat generated in the electronic module is less likely to dissipate out of the electronic module, increasing a likelihood that the electronic module would fail.

The present invention is made to solve problems as described above, and its object is to sense peeling occurred in electronic modules.

Solution To Problem

The electronic module according to the present invention includes a specified conductor, an insulating layer, a wiring layer, and a capacitance-to-voltage converter. The wiring layer includes a sense electrode. The capacitance-to-voltage converter is connected to the sense electrode. The sense electrode is opposed to a portion of the specified conductor via the insulating layer, and forms a capacitance with the portion. The capacitance-to-voltage converter is configured to output a voltage according to the capacitance.

ADVANTAGEOUS EFFECTS OF INVENTION

As the specified conductor is peeling from the insulating layer, the capacitance, which is formed between the sense electrode and the portion of the specified conductor opposite the sense electrode, changes. The changes in the capacitance are sensed as changes in a voltage output from the capacitance-to-voltage converter. According to the electronic module of the present invention, peeling of the specified substrate from the insulating layer can be sensed by referring to the voltage output from the capacitance-to-voltage converter.

DESCRIPTION OF EMBODIMENTS

Figure 1:
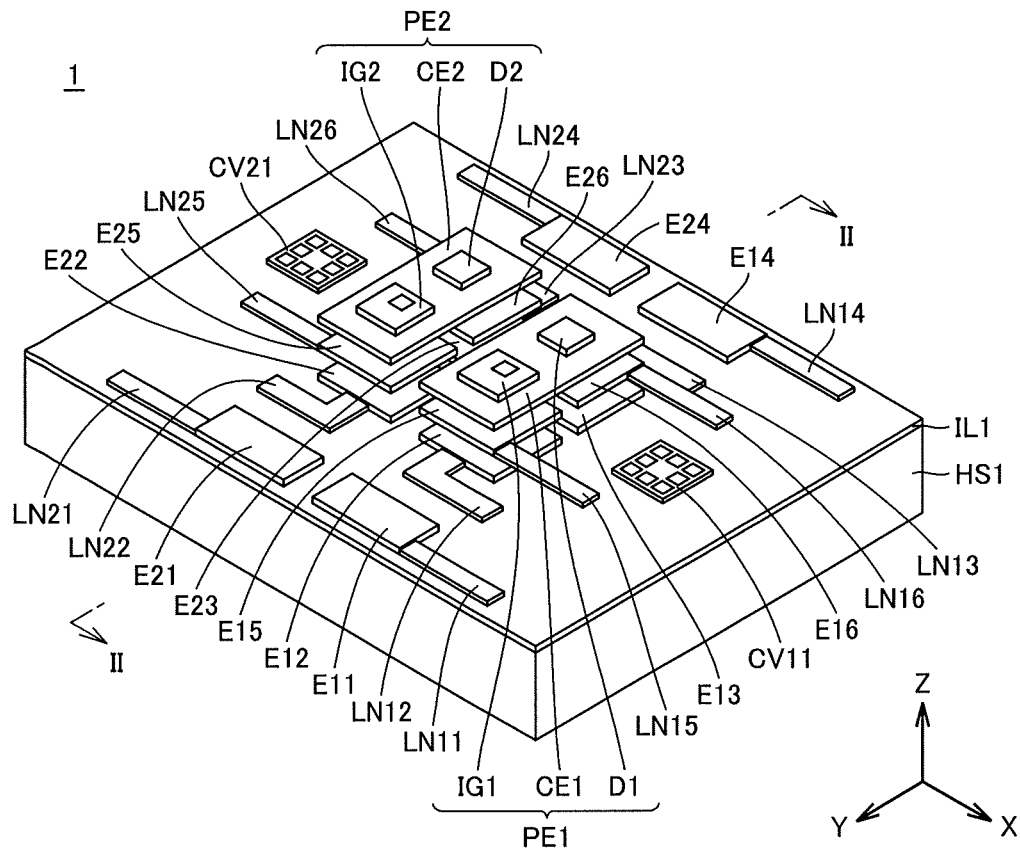
FIG. 1 is an external perspective view of a power module, which is one example an electronic module according to Embodiment 1.

Hereinafter, embodiments of the present invention will be described, with reference to the accompanying drawings. Note that like reference signs are used to refer to like or corresponding parts in the drawings, and the description thereof will, in principle, not be repeated.

Embodiment 1

Figure 2:
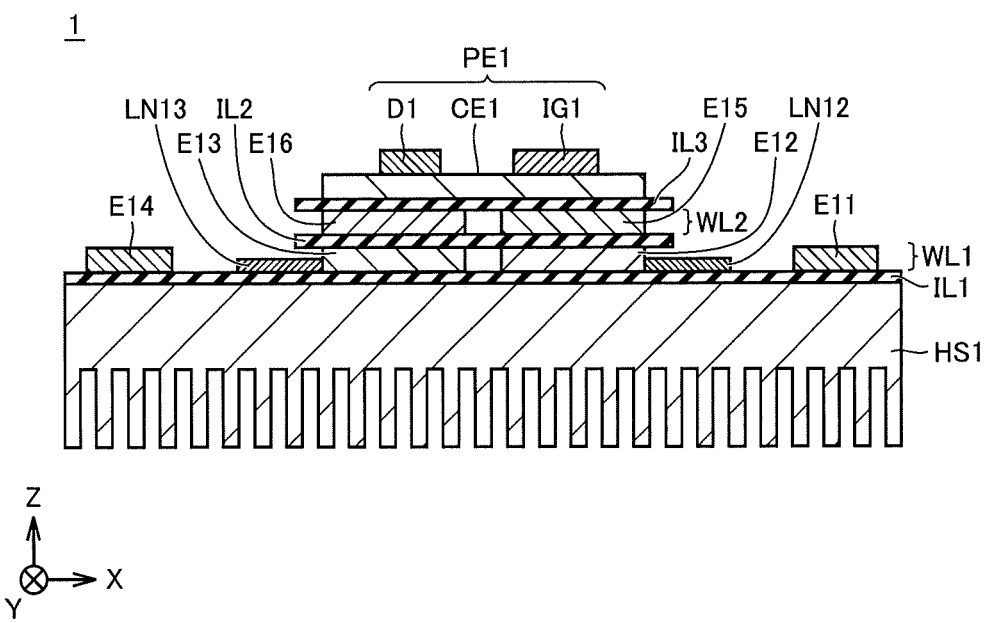
FIG. 2 is a cross section of the power module viewed from II-II line of FIG. 1.

FIG. 1 is an external perspective view of a power module 1, which is one example of an electronic module according to Embodiment 1. FIG. 2 is a cross section of power module 1 viewed from II-II line of FIG. 1. As shown in FIGS. 1 and 2, power module 1 includes power elements PE1, PE2, insulating layers IL1, IL2, and IL3, wiring layers WL1, WL2, capacitance-to-voltage converters CV11, CV21, and a heat sink substrate HS1. Insulating layers IL2, IL3, shown in FIG. 2 are not shown in FIG. 1 to facilitate the legibility of electrodes disposed on the wiring layers.

Heat sink substrate HS1, insulating layer IL1, wiring layer WL1, insulating layer IL2, wiring layer WL2, and insulating layer IL3 are stacked in Z-axis direction in the listed order. Heat sink substrate HS1 corresponds to a specified conductor according to the present invention.

Wiring layer WL1 includes capacitance-to-voltage converters CV11, CV21, electrodes E11, E12, E13, E14, E21, E22, E23, E24, and lead lines LN11, LN12, LN13, LN14, LN21, LN22, LN23, LN24. Electrodes E11 to E14 are connected to lead lines LN11 to LN14, respectively. Lead lines LN11 to LN14 are connected to capacitance-to-voltage converter CV11 through wiring not shown. Electrodes E21 to E24 are connected to lead lines LN21 to LN24, respectively. Lead lines LN21 to LN24 are connected to capacitance-to-voltage converter CV21 through wiring not shown. Capacitance-to-voltage converters CV11 and CV21 have the same circuit structure.

Electrodes E11, E14, E21, E24 are opposed to heat sink substrate HS1 via insulating layer IL1. Electrodes E11, E14, E21, E24 each correspond to a sense electrode according to the present invention. Electrodes E11, E14, E21, E24 are disposed on the outer periphery side of heat sink substrate HS1 rather than the central portion thereof. Electrodes E11 and E14 are disposed symmetrically about the symmetry axis (not shown) parallel to X-axis. The area of electrode E11 and the area of electrode E14 in plan view from Z-axis direction are approximately equal. Electrodes E21 and E24 are disposed symmetrically about the symmetry axis (not shown) parallel to X-axis. The area of electrode E21 and the area of electrode E24 in plan view from Z-axis direction are approximately equal.

Electrodes E12, E13, E22, E23 each correspond to a capacitor electrode according to the present invention. Electrodes E12 and E13 are disposed symmetrically about the symmetry axis (not shown) parallel to X-axis. The area of electrode E12 and the area of electrode E13 in plan view from Z-axis direction are approximately equal. Electrodes E22 and E23 are disposed symmetrically about the symmetry axis (not shown) parallel to X-axis. The area of electrode E22 and the area of electrode E23 in plan view from Z-axis direction are approximately equal.

Wiring layer WL2 includes electrodes E15, E16, E25, E26, and lead lines LN15, LN16, LN25, LN26. Electrodes E15, E16, E25, E26 each correspond to the sense electrode according to the present invention.

Electrodes E15 and E16 are connected to lead lines LN15 and LN16, respectively. Lead lines LN15 and LN16 are connected to capacitance-to-voltage converter CV11 through wiring not shown. Electrodes E15 and E16 are opposed to electrodes E12 and E13, respectively, via insulating layer IL2. Electrodes E15 and E16 are disposed symmetrically about the symmetry axis (not shown) parallel to X-axis. The area of electrode E15 and the area of electrode E16 in plan view from Z-axis direction are approximately equal.

Electrodes E25 and E26 are connected to lead lines LN25 and LN26, respectively. Lead lines LN25 and LN26 are connected to capacitance-to-voltage converter CV21 through wiring not shown. Electrodes E25 and E26 are opposed to electrodes E22 and E23, respectively, via insulating layer IL2. Electrodes E25 and E26 are disposed symmetrically about the symmetry axis (not shown) parallel to X-axis. The area of electrode E25 and the area of electrode E26 in plan view from Z-axis direction are approximately equal.

Power elements PE1 and PE2 are disposed on insulating layer IL3. Power element PE1 includes a semiconductor switch IG1, a diode D1, and a common collector electrode CE1. Semiconductor switch IG1 and diode D1 are disposed on common collector electrode CE1. Power element PE2 includes a semiconductor switch IG2, a diode D2, and a common collector electrode CE2. Semiconductor switch IG2 and diode D2 are disposed on common collector electrode CE2. Semiconductor switches IG1, IG2 each include an IGBT (Insulated Gate Bipolar Transistor). Common collector electrodes CE1, CE2 each correspond to the specified conductor according to the present invention.

Electrodes E15 and E16 are opposed to common collector electrode CE1 via insulating layer IL3. Capacitance is formed between electrode E15 and a portion of common collector electrode CE1 opposite the electrode E15. Capacitance is formed between electrode E16 and a portion of common collector electrode CE1 opposite the electrode E16.

Electrodes E25 and E26 are opposed to common collector electrode CE2 via insulating layer IL3. Capacitance is formed between electrode E25 and a portion of common collector electrode CE2 opposite the electrode E25. Capacitance is formed between electrode E26 and a portion of common collector electrode CE2 opposite the electrode E26.

Figure 3:
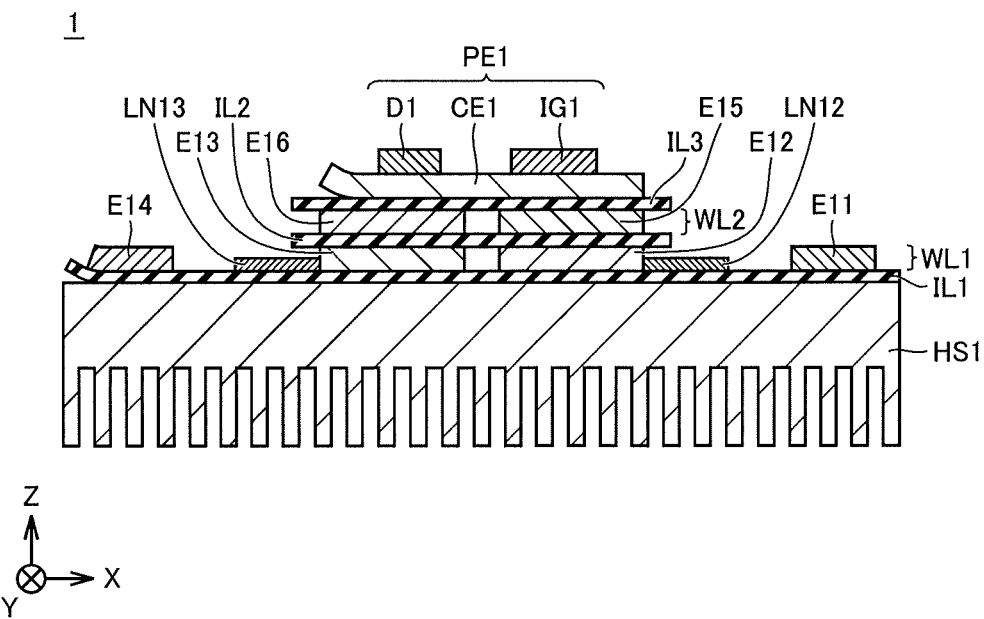
FIG. 3 is a diagram showing an electrode peeling in the power module of FIG. 1.

In power module 1, for example as shown in FIG. 3, common collector electrode CE1 may be peeling from insulating layer IL3 or insulating layer IL1 may be peeling from heat sink substrate HS1, due to temperature cycling. Power module 1 may supply large power and thus may generate heat significantly. Therefore, if the peeling as shown in FIG. 3 occurs, conduction of heat is disturbed at the peeled portion. The heat generated in power module 1 is less likely to dissipate out of the power module 1, increasing likelihood that power module 1 would fail.

Given this situation, focusing on the fact that capacitance formed by opposing electrodes, via the insulating layer, decreases as one of the two electrodes peels from the other, power module 1 senses the occurrence of the peeling. In the following, a mechanism of sensing the peeling according to the present invention will be described, with reference to FIGS. 4 through 6.

Figure 4:
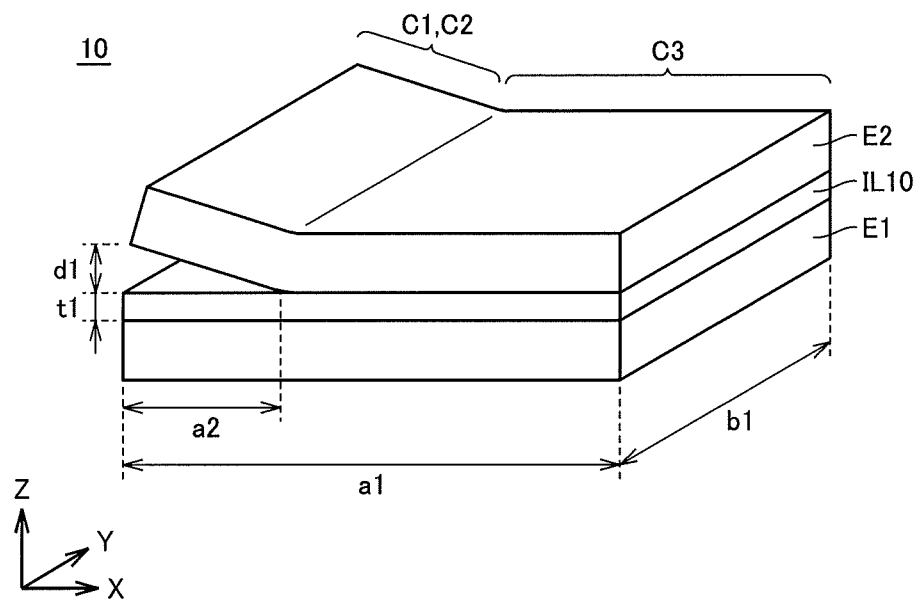
FIG. 4 is a diagram showing a stack in which two electrodes and an insulating layer are stacked in Z-axis direction.

FIG. 4 is a diagram showing a stack 10 in which electrodes E1, E2 and insulating layer IL10 are stacked in Z-axis direction. As shown in FIG. 4, stack 10 is in a cuboid shape. In stack 10, electrode E1, insulating layer IL10, and electrode E2 are stacked in Z-axis direction in the listed order. Electrodes E1 and E2 are opposing to each other via insulating layer IL10, and form a capacitor C10. In FIG. 4, electrode E2 is peeling from insulating layer IL10.

Figure 5:
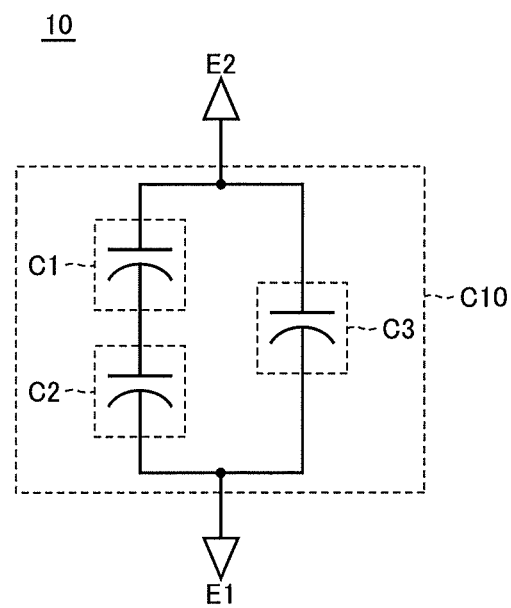
FIG. 5 is a diagram showing a configuration of a capacitor formed between the two electrodes shown in FIG. 4.

FIG. 5 is a diagram showing capacitor C10 formed between electrodes E1 and E2 shown in FIG. 4. As shown in FIG. 5, capacitor C10 includes capacitors C1, C2, C3. In FIG. 5, capacitors C1 and C2 correspond to capacitances formed between the peeled portions of electrode E2 from electrode E1 opposed to each other. Capacitor C3 corresponds to a capacitance formed between electrodes E1 and E2 where there is no peeling. As shown in FIG. 5, capacitors C1 and C2 are connected in series. Capacitor C3 is connected in parallel with capacitors C1 and C2 connected in series.

Suppose that stack 10 is disposed in a vacuum and the dielectric constant for the vacuum is ε0. Suppose that the dielectric constant for insulating layer IL10 is ε1. Suppose that the length (width) of stack 10 in X-axis direction is a1, the length (depth) of stack 10 in Y-axis direction is b1, the width of a peeled portion (crack) of stack 10 is a2, the length (thickness) of insulating layer IL10 in Z-axis direction is t1, and the maximum distance (amount of peeling) between electrode E2 and insulating layer IL10 is d1. The capacitances at capacitors C1 to C3 are represented by Equations (1) through (3) below, respectively.

[Math 1]

$$C_1 = \frac{\varepsilon_0 a_2 b_1}{d_1} \log \frac{d_1 + 2t_1}{-d_1 + 2t_1} \quad (1)$$

$$C_2 = \frac{\varepsilon_1 \varepsilon_0 a_2 b_1}{t_1} \quad (2)$$

$$C_3 = \frac{\varepsilon_0 \varepsilon_1 (a_1 - a_2)}{t_1} \quad (3)$$

When amount d1 of peeling is very small as compared to thickness t1 of insulating layer IL10 (d1<t1), capacitor C1 is nearly zero. In this case, the peeling of electrode E2 from insulating layer IL10 is not reflected in changes in capacitance at capacitor C10. However, as the amount d1 of peeling increases to some extent, the peeling of electrode E2 from insulating layer IL10 appears as changes in capacitance at capacitor C1. For example, where width a1 is 1e−2 ($1.0 \times 10^{-2}$); depth b1 is 5e−3 ($5.0 \times 10^{-3}$); amount d1 of peeling is 1e−6 ($1.0 \times 10^{-6}$); and width a2 of the crack is 1e−3 ($1.0 \times 10^{-3}$), the capacitance at capacitor C10 varies by about 0.03% because of the peeling of electrode E2 from insulating layer IL10. If the S/N ratio between a capacitance-to-voltage converter, to which the capacitance of capacitor C10 is input, and an analog-to-digital converter subsequent to the capacitance-to-voltage converter is about 70 dB, the variation at capacitor C10 caused by the peeling of electrode E2 can be sensed.

Figure 6:
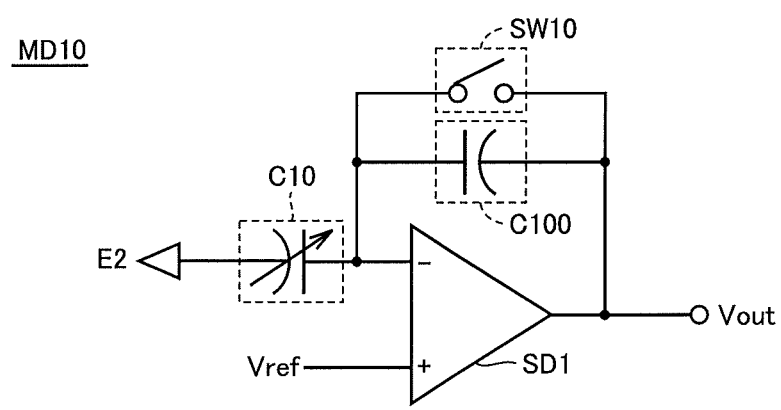
FIG. 6 is a circuit diagram of a fault sensing circuit which senses changes in capacitance of the capacitor shown in FIG. 5.

FIG. 6 is a circuit diagram of a fault sensing circuit MD10, which senses changes in the capacitance at capacitor C10 shown in FIG. 5. As shown in FIG. 6, fault sensing circuit MD10 includes a single differential amplifier SD1, a capacitor C100, and a switch SW10.

Differential amplifier SD1 has an inverting input terminal connected to capacitor C10. Specifically, electrode E1 in FIG. 4, which is included in capacitor C10, is connected to the inverting input terminal of differential amplifier SD1. Differential amplifier SD1 has a non-inverting input terminal through which a reference voltage Vref is input.

Capacitor C100 is connected between the inverting input terminal of differential amplifier SD1 and an output terminal Vout of differential amplifier SD1. Switch SW10 is connected in parallel with capacitor C100, between the inverting input terminal and output terminal Vout of differential amplifier SD1. Switch SW10 changes, at any time, to a conductive state, which resets electric charge stored in capacitor C100. Switch SW10 may periodically change to the conductive state based on a clock signal to reset the electric charge stored at capacitor C100.

When stack 10 has no peeling, electric charge C10·Vref is stored at capacitor C10. Suppose that peeling as shown in FIG. 4 has occurred at stack 10 and the capacitance at capacitor C10 has decreased by ΔC. Excess electric charge (ΔC·Vref) that cannot be stored at capacitor C10 is generated, causing a temporal increase in voltage at the inverting input terminal of differential amplifier SD1. The output voltage of differential amplifier SD1 decreases and the voltage across capacitor C100 increases so that the excess electric charge can be stored at capacitor C100. In other words, when peeling occurs at stack 10, the capacitance at capacitor C10 decreases. As a result, the output voltage of differential amplifier SD1 decreases as well.

Fault sensing circuit MD10 shown in FIG. 6 can sense the peeling of electrode E2 from insulating layer IL10 of stack 10, as a decrease of the output voltage of differential amplifier SD1. For example, fault sensing circuit MD10 can sense, using a micro controller (not shown), the minimum value (peak) of the output voltage of differential amplifier SD1 over a certain period of time, and determine that peeling has occurred at a moment the peak falls below a threshold. Fault sensing circuit MD10 may also determine the occurrence of peeling by AM (Amplitude Modulation) using an envelope of the output voltage of differential amplifier SD1 or by performing peak holding.

The mechanism of sensing the peeling according to the present invention has been described in FIG. 6, using a single differential amplifier. The sensing of peeling according to the present invention can be achieved, insofar as a circuit structure is provided in which an excess electric charge is generated due to a decrease in the capacitance at the capacitor connected to the differential amplifier, and the output voltage of the differential amplifier decreases to store the excess electric charge at another capacitor. The circuit structure can be implemented also by a fully-differential amplifier.

A fully-differential amplifier outputs, to two output terminals, output signals that are in anti-phase. A signal amplitude as twice as much as that obtained by a single differential amplifier can be obtained by taking a difference between the two output signals. In other words, the variation in the output voltage due to the occurrence of peeling is greater in a fully-differential amplifier than in a single differential amplifier. Therefore, even if peeling that cannot be sensed by a single differential amplifier may be able to be sensed by using a fully-differential amplifier. Thus, in Embodiment 1, peeling is sensed using a fully-differential amplifier.

Figure 7:
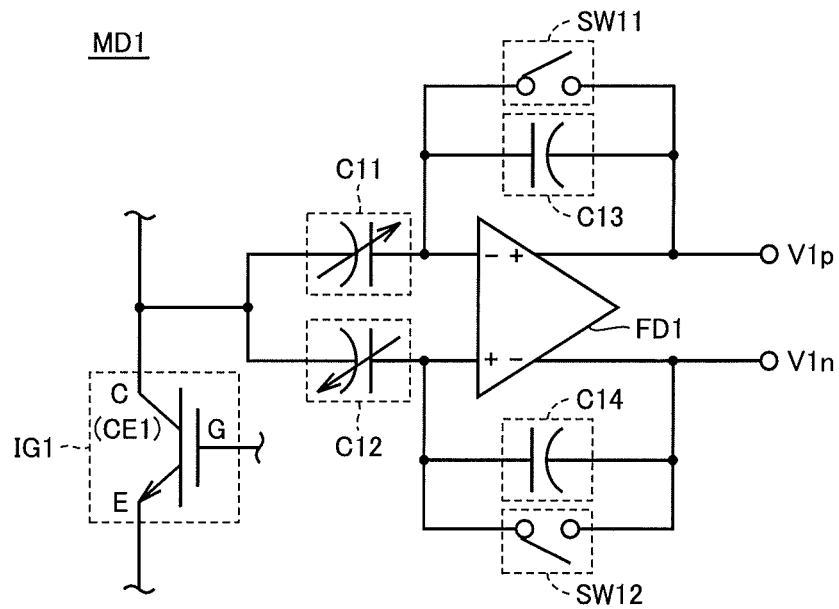
FIG. 7 is a circuit diagram of a fault sensing circuit for sensing the peeling of a common collector electrode from the insulating layer shown in FIG. 3.

FIG. 7 is a circuit diagram of a fault sensing circuit MD1 for sensing peeling of common collector electrode CE1 from insulating layer IL3 shown in FIG. 3. As shown in FIG. 7, fault sensing circuit MD1 includes variable capacitors C11, C12, a fully-differential amplifier FD1, capacitors C13, C14, and switches SW11, SW12.

Variable capacitor C11 is connected between a collector electrode (common collector electrode CE1) of semiconductor switch IG1 and an inverting input terminal of fully-differential amplifier FD1. Variable capacitor C12 is connected between the collector electrode of semiconductor switch IG1 and a non-inverting input terminal of fully-differential amplifier FD1.

Capacitor C13 is connected between the inverting input terminal and an output terminal V1p of fully-differential amplifier FD1. Switch SW11 is connected in parallel with capacitor C13, between the inverting input terminal and output terminal V1p of fully-differential amplifier FD1. Switch SW11 changes, at any time, to a conductive state, which resets electric charge stored at capacitor C13. Switch SW11 may periodically change to the conductive state based on a clock signal to reset the electric charge stored at capacitor C13.

Capacitor C14 is connected between the non-inverting input terminal and an output terminal V1n of fully-differential amplifier FD1. Switch SW12 is connected in parallel with capacitor C14, between the non-inverting input terminal and output terminal V1n of fully-differential amplifier FD1. Switch SW12 changes, at any time, to a conductive state, which resets electric charge stored at capacitor C14. Switch SW12 may periodically change to the conductive state based on a clock signal to reset the electric charge stored at capacitor C14.

Referring to FIGS. 3 and 7, variable capacitor C11 corresponds to the capacitance formed between electrode E15 and the portion of common collector opposite the electrode CE1. Electrode E15 is connected to the inverting input terminal of fully-differential amplifier FD1. Variable capacitor C12 corresponds to the capacitance formed between electrode E16 and the portion of common collector electrode CE1 opposite the electrode E16. Electrode E16 is connected to the non-inverting input terminal of fully-differential amplifier FD1.

Capacitor C13 corresponds to a capacitance formed between electrodes E15 and E12. Electrode E12 is connected to output terminal V1p of fully-differential amplifier FD1. Capacitor C14 corresponds to a capacitance formed between electrodes E16 and E13. Electrode E13 is connected to output terminal V1n of fully-differential amplifier FD1.

Fully-differential amplifier FD1 and switches SW11, SW12 shown in FIG. 7 are implemented in capacitance-to-voltage converter CV11 shown in FIG. 1.

Figure 8:
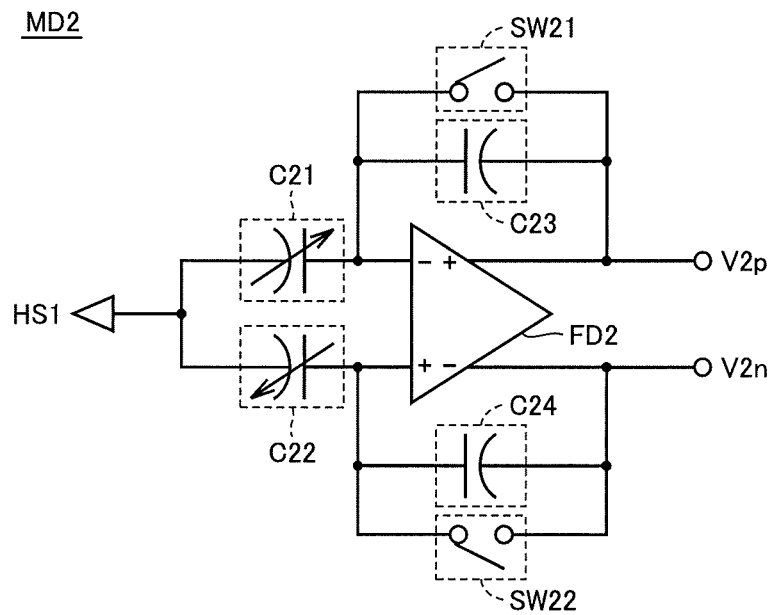
FIG. 8 is a circuit diagram of a fault sensing circuit for sensing the peeling of the insulating layer from a heat sink substrate shown in FIG. 3.

FIG. 8 is a circuit diagram of fault sensing circuit MD2 for sensing the peeling of insulating layer IL1 from heat sink substrate HS1 shown in FIG. 3. As shown in FIG. 8, fault sensing circuit MD2 includes variable capacitors C21, C22, a fully-differential amplifier FD2, capacitors C23, C24, and switches SW21, SW22.

Variable capacitor C21 is connected between heat sink substrate HS1 and the inverting input terminal of fully-differential amplifier FD2. Variable capacitor C22 is connected between heat sink substrate HS1 and the non-inverting input terminal of fully-differential amplifier FD2.

Capacitor C23 is connected between the inverting input terminal and an output terminal V2p of fully-differential amplifier FD2. Switch SW21 is connected in parallel with capacitor C23, between the inverting input terminal and the output terminal V2p of fully-differential amplifier FD2. Switch SW21 changes, at any time, to a conductive state, which resets electric charge stored at capacitor C23. Switch SW21 may periodically change to the conductive state based on a clock signal to reset the electric charge stored at capacitor C23.

Capacitor C24 is connected between the non-inverting input terminal and the output terminal V2n of fully-differential amplifier FD2. Switch SW22 is connected in parallel with capacitor C24, between the non-inverting input terminal and the output terminal V2n of fully-differential amplifier FD2. Switch SW22 changes, at any time, to a conductive state, which resets electric charge stored at capacitor C24. Switch SW22 may periodically change to the conductive state based on a clock signal to reset the electric charge stored at capacitor C24.

Referring to FIGS. 3 and 8, variable capacitor C21 corresponds to the capacitance formed between electrode E11 and a portion of heat sink substrate HS1 opposite the electrode E11. Electrode E11 is connected to the inverting input terminal of fully-differential amplifier FD2. Variable capacitor C22 corresponds to a capacitance formed between electrode E14 and a portion of heat sink substrate HS1 opposite the electrode E14. Electrode E14 is connected to the non-inverting input terminal of fully-differential amplifier FD2.

Fully-differential amplifier FD2, capacitors C23, C24, and switches SW21, SW22, shown in FIG. 8, are implemented in capacitance-to-voltage converter CV11 shown in FIG. 1.

Embodiment 1 has been described with reference to the case where the semiconductor switch, included in the power element, includes an IGBT and the peeling of the collector electrode of the IGBT from the insulating layer is sensed. The semiconductor switch may include an FET (Field Effect Transistor). In that case, a drain electrode of the FET corresponds to the specified conductor according to the present invention. According to the electronic module of Embodiment 1, peeling of the drain electrode from the insulating layer can be sensed.

As described above, according to the electronic module of Embodiment 1, peeling of the specified substrate from the insulating layer and vice versa can be sensed by referring to a voltage output from the capacitance-to-voltage converter. Moreover, according to the electronic module of Embodiment 1, use of a fully-differential amplifier allows for highly accurately sensing the peeling of the specified substrate from the insulating layer and vice versa, as compared to when a single differential amplifier is used. Furthermore, according to the electronic module of Embodiment 1, peeling of each of two specified conductors can be sensed.

Embodiment 2

In Embodiment 1, peeling of the common collector electrode from the insulating layer and peeling of the insulating layer from the heat sink substrate can both be sensed. In other words, Embodiment 1 has been described with reference to the case where peeling of each of two specified conductors can be sensed. Embodiment 2 will be described with reference to sensing the peeling of only one of two specified conductors.

Figure 9:
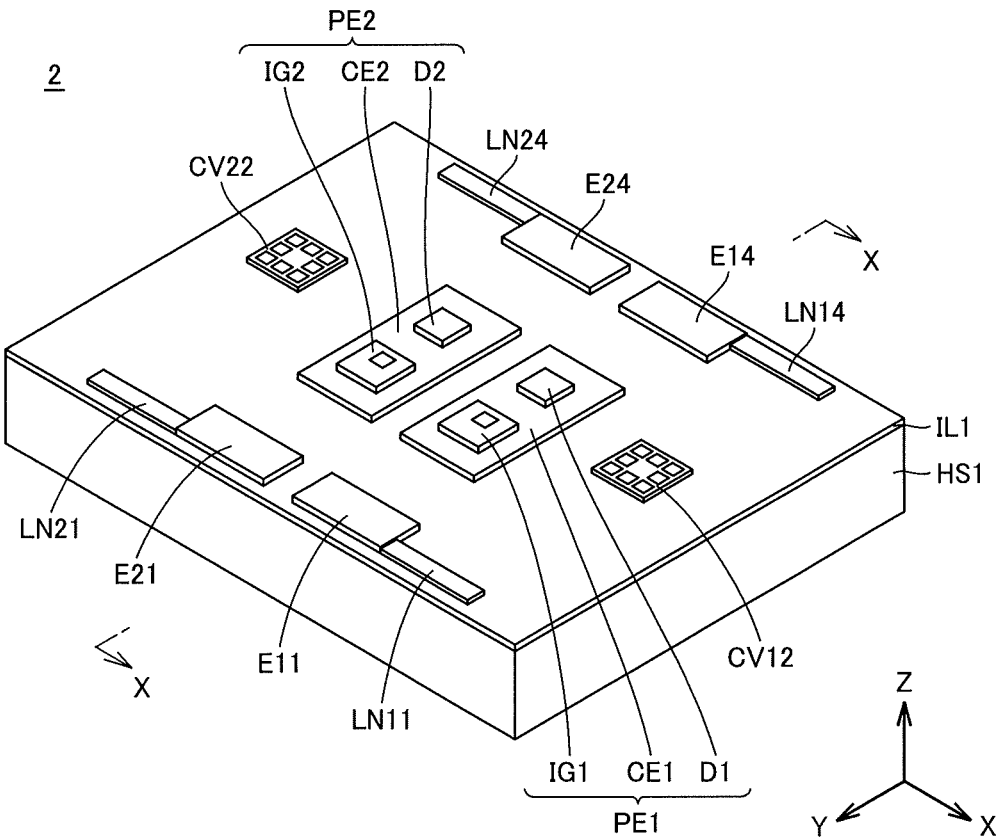
FIG. 9 is an external perspective view of a power module, which is one example of an electronic module according to Embodiment 2.
Figure 10:
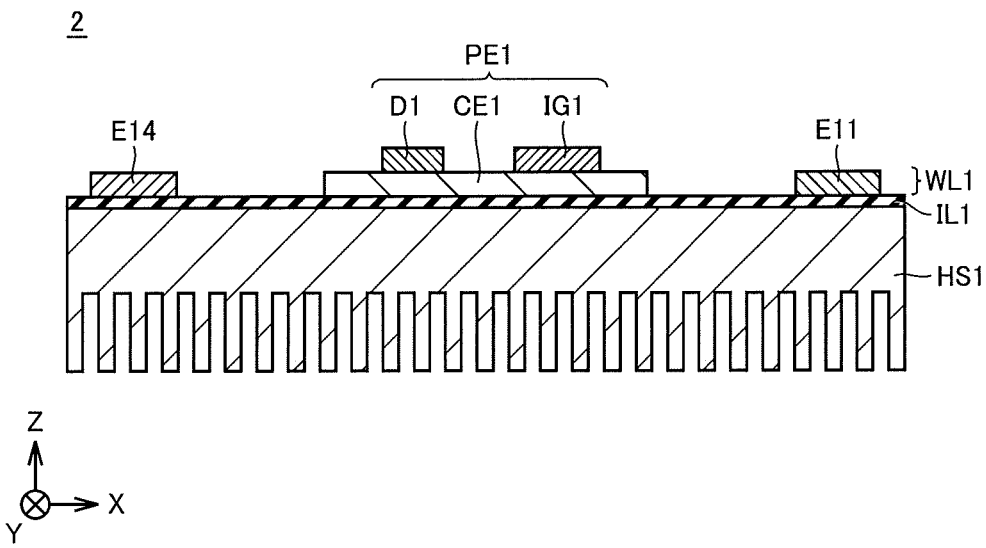
FIG. 10 is a cross section of the power module viewed from X-X line of FIG. 9.

FIG. 9 is an external perspective view of a power module 2, which is one example of an electronic module according to Embodiment 2. FIG. 10 is a cross section of power module 2 viewed from X-X line of FIG. 9. The configuration of power module 2, shown in FIGS. 9 and 10, does not include insulating layers IL2, IL3, electrodes E12, E13, E15, E16, E22, E23, E25, E26, and lead lines LN12, LN13, LN15, LN16, LN22, LN23, LN25, LN26 from the configuration of power module 1 shown in FIGS. 1 and 2, and includes capacitance-to-voltage converters CV12, CV22, in place of capacitance-to-voltage converters CV11, CV21, respectively.

Power elements PE1, PE2 are disposed on insulating layer IL1. Fully-differential amplifier FD2, capacitors C23, C24, and switches SW21, SW22, shown in FIG. 8, are implemented in capacitance-to-voltage converter CV12. Fault sensing circuit MD2, shown in FIG. 8, is formed in power module 2. Capacitance-to-voltage converters CV12 and CV22 have the same circuit structure.

In power module 2 shown in FIGS. 9 and 10, peeling of insulating layer IL1 from heat sink substrate HS1 is sensed by fault sensing circuit MD2, while peeling of common collector electrode CE1 from the insulating layer is not sensed. However, this allows power module 2 to have a less number of insulating layers and a less number of electrodes, as compared to power module 1 shown in FIG. 1, allowing reduction of the manufacturing cost, and size reduction and profile reduction as shown in FIG. 10, as compared to power module 1.

As described above, according to the electronic module of Embodiment 2, peeling of the specified substrate from the insulating layer and vice versa can be sensed by referring to a voltage output from the capacitance-to-voltage converter. Moreover, according to the electronic module of Embodiment 2, use of the fully-differential amplifier allows for highly accurately sensing the peeling of the specified substrate from the insulating layer and vice versa, as compared to when a single differential amplifier is used. Furthermore, according to the electronic module of Embodiment 2, the manufacturing cost can be reduced and size reduction and profile reduction can also be achieved, as compared to Embodiment 1.

Embodiment 3

Embodiment 1 has been described with reference to the case where the capacitor electrode, included in the capacitor included in the fault sensing circuit, is disposed external to the capacitance-to-voltage converter. Embodiment 3 will be described with reference to implementing, inside a capacitance-to-voltage converter, a capacitor included in a fault sensing circuit.

Figure 11:
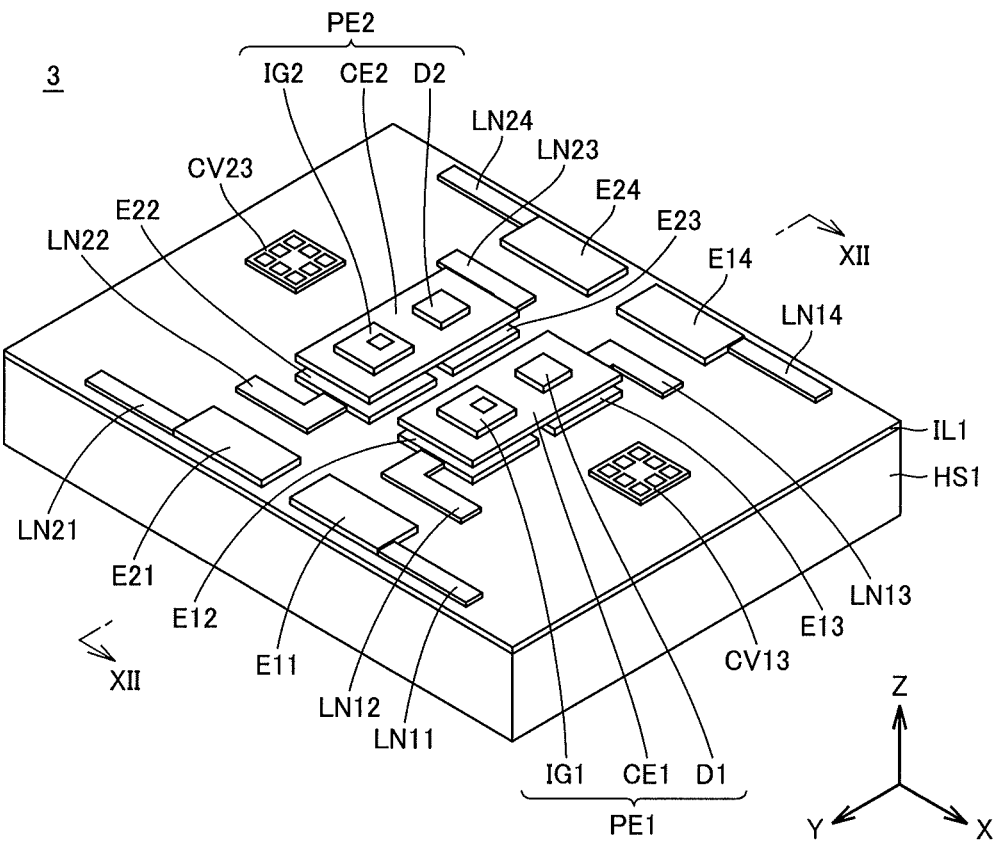
FIG. 11 is an external perspective view of a power module, which is one example of an electronic module according to Embodiment 3.
Figure 12:
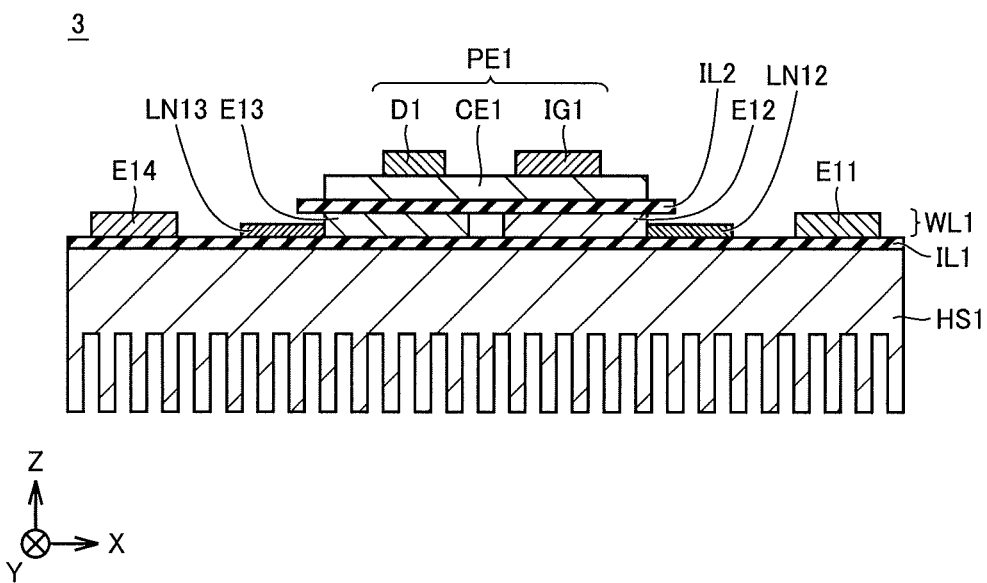
FIG. 12 is a cross section of the power module viewed from XII-XII line of FIG. 11.

FIG. 11 is an external perspective view of a power module 3, which is one example of an electronic module according to Embodiment 3. FIG. 12 is a cross section of power module 3 viewed from XII-XII line of FIG. 11. The configuration of power module 3 shown in FIGS. 11 and 12 does not include insulating layer IL3, electrodes E15, E16, E25, E26, and lead lines LN15, LN16, LN25, LN26 from the configuration of power module 1 shown in FIGS. 1 and 2, and includes capacitance-to-voltage converters CV13, CV23, in place of capacitance-to-voltage converters CV11, CV21, respectively, in FIG. 1. Capacitance-to-voltage converters CV13 and CV23 have the same circuit structure.

Power elements PE1, PE2 are disposed on insulating layer IL2. Electrodes E12 and E13 are opposite the common collector electrode CE1 via insulating layer IL2. A capacitance is formed between electrode E12 and a portion of common collector electrode CE1 opposite the electrode E12. A capacitance is formed between electrode E13 and a portion of common collector electrode CE1 opposite the electrode E13.

Figure 13:
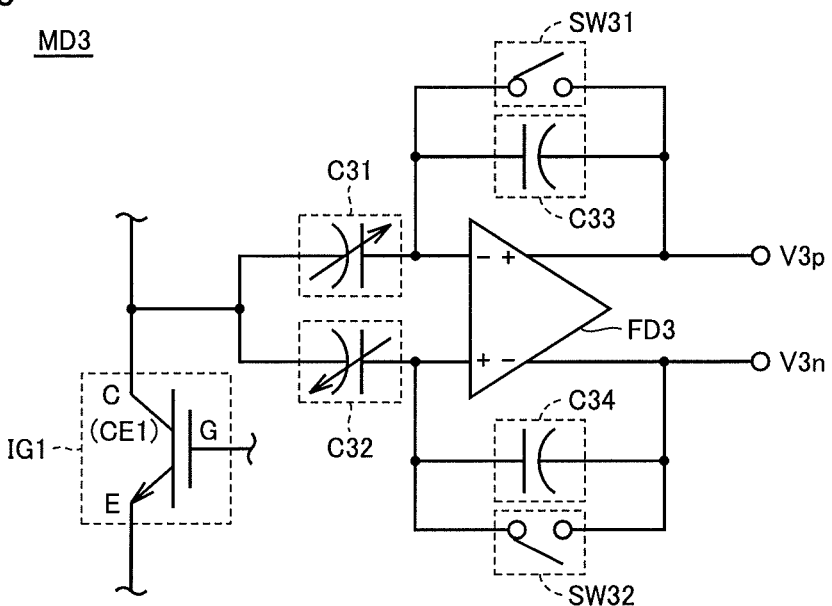
FIG. 13 is a circuit diagram of a fault sensing circuit for sensing the peeling of a common collector electrode from an insulating layer shown in FIG. 12.

FIG. 13 is a circuit diagram of a fault sensing circuit MD3 for sensing the peeling of common collector electrode CE1 from insulating layer IL2 shown in FIG. 12. As shown in FIG. 13, fault sensing circuit MD3 includes variable capacitors C31, C32, a fully-differential amplifier FD3, capacitors C33, C34, and switches SW31, SW32.

Variable capacitor C31 is connected between a collector electrode of a semiconductor switch IG1 and an inverting input terminal of fully-differential amplifier FD3. Variable capacitor C32 is connected between the collector electrode of semiconductor switch IG1 and a non-inverting input terminal of fully-differential amplifier FD3.

Capacitor C33 is connected between the inverting input terminal and an output terminal V3p of fully-differential amplifier FD3. Switch SW31 is connected in parallel with capacitor C33, between the inverting input terminal and output terminal V3p of fully-differential amplifier FD3. Switch SW31 changes, at any time, to a conductive state, which resets electric charge stored at capacitor C33. Switch SW31 may periodically change to the conductive state based on a clock signal to reset the electric charge stored at capacitor C33.

Capacitor C34 is connected between the non-inverting input terminal and an output terminal V3n of fully-differential amplifier FD3. Switch SW32 is connected in parallel with capacitor C34, between the non-inverting input terminal and output terminal V3n of fully-differential amplifier FD3. Switch SW32 changes, at any time, to a conductive state, which resets electric charge stored at capacitor C34. Switch SW32 may periodically change to the conductive state based on a clock signal to reset the electric charge stored at capacitor C34.

Referring to FIGS. 12 and 13, variable capacitor C31 corresponds to a capacitance formed between electrode E12 and a portion of common collector electrode CE1 opposite the electrode E12. Electrode E12 is connected to the inverting input terminal of fully-differential amplifier FD3. Variable capacitor C32 corresponds to a capacitance formed between electrode E13 and a portion of common collector electrode CE1 opposite the electrode E13. Electrode E13 is connected to the non-inverting input terminal of fully-differential amplifier FD3.

Fully-differential amplifier FD3, capacitors C33, C34, and switches SW31, SW32, shown in FIG. 12, are implemented in capacitance-to-voltage converter CV13 shown in FIG. 11. Fault sensing circuit MD2 for sensing the peeling of insulating layer IL3 from heat sink substrate HS1, is formed in capacitance-to-voltage converter CV13.

In power module 3, since capacitors C33, C34 are implemented in capacitance-to-voltage converter CV13, the number of insulating layers and the number of electrodes are less than those included in power module 1 in FIG. 1. Therefore, the manufacturing cost for power module 3 can be reduced and size reduction and profile reduction can also be achieved, as compared to power module 1.

As described above, according to the electronic module of Embodiment 3, peeling of the specified substrate from the insulating layer and vice versa can be sensed by referring to a voltage output from the capacitance-to-voltage converter. Moreover, according to the electronic module of Embodiment 3, use of the fully-differential amplifier allows for highly accurately sensing the peeling of the specified substrate from the insulating layer and vice versa, as compared to when a single differential amplifier is used. According to the electronic module of Embodiment 3, peeling of each of two specified conductors can be sensed. Furthermore, according to the electronic module of Embodiment 3, the manufacturing cost can be reduced and size reduction and profile reduction can be achieved, as compared to the electronic module according to Embodiment 1.

Embodiment 4

Embodiment 1 has been described with reference to two sense electrodes corresponding to one specified conductor. According to the electronic module of Embodiment 1, as the distance between each sense electrode and the specified conductor changes because of the peeling of the sense electrode from the specified conductor, the capacitance formed between the sense electrode and the specified conductor changes, and thus the peeling can be sensed. However, it can be difficult to sense the peeling in limited cases where the variation in distance between one sense electrode and the specified conductor and the variation in distance between the other sense electrode and the specified conductor are substantially the same.

Figure 14:
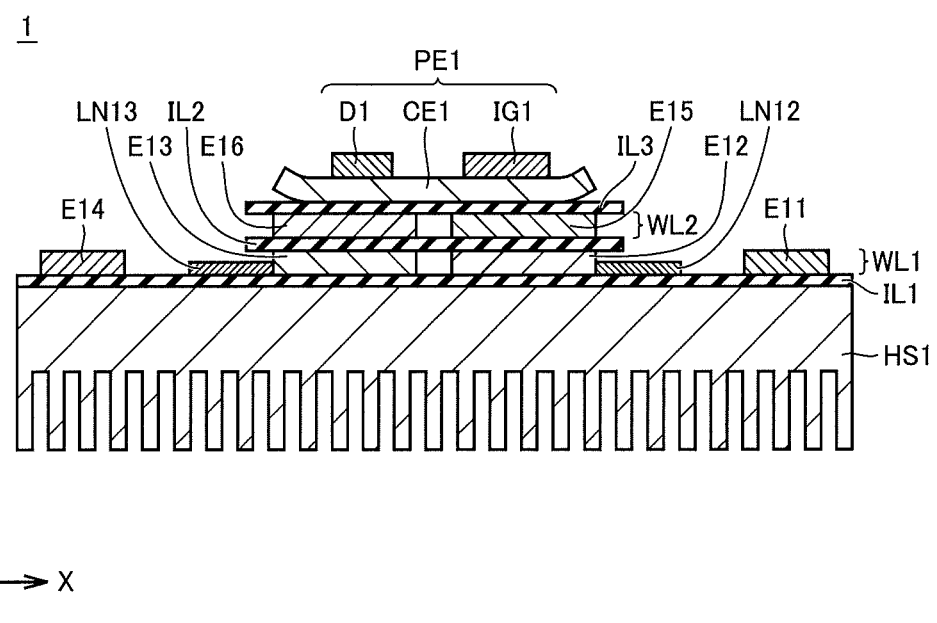
FIG. 14 is a diagram showing the common collector electrode having both sides peeled off in X-axis direction in power module 1 shown in FIG. 2.

FIG. 14 is a diagram showing common collector electrode CE1 having both sides peeled off in X-axis direction in power module 1 shown in FIG. 2. In FIG. 14, if the variation in distance between common collector electrode CE1 and electrode E15 due to the peeling of common collector electrode CE1 from electrode E15 and the variation in distance between common collector electrode CE1 and electrode E16 due to the peeling of common collector electrode CE1 from electrode E16 are substantially the same, the variation in capacitance at variable capacitor C11 and the variation in capacitance at variable capacitor C12 shown in FIG. 7 are substantially the same. Even when the peeling occurs, there is little change in voltage difference between the inverting input terminal and the non-inverting input terminal of fully-differential amplifier FD1. Thus, there is little change in output voltage of fully-differential amplifier FD1 too. As shown in FIG. 14, if both sides of the specified conductor peel off to a similar extent, it can be difficult to sense this peeling by the electronic module according to Embodiment 1.

Now, Embodiment 4 will be described with reference to using four sense electrodes linearly disposed for one specified conductor. In Embodiment 4, two sense electrodes are used to sense peeling of one side of a specified conductor and another two sense electrodes are used to sense peeling of the other side of the specified conductor. According to the electronic module of Embodiment 4, even the peeling of the both sides of the specified conductor to a similar extent can be sensed.

Figure 15:
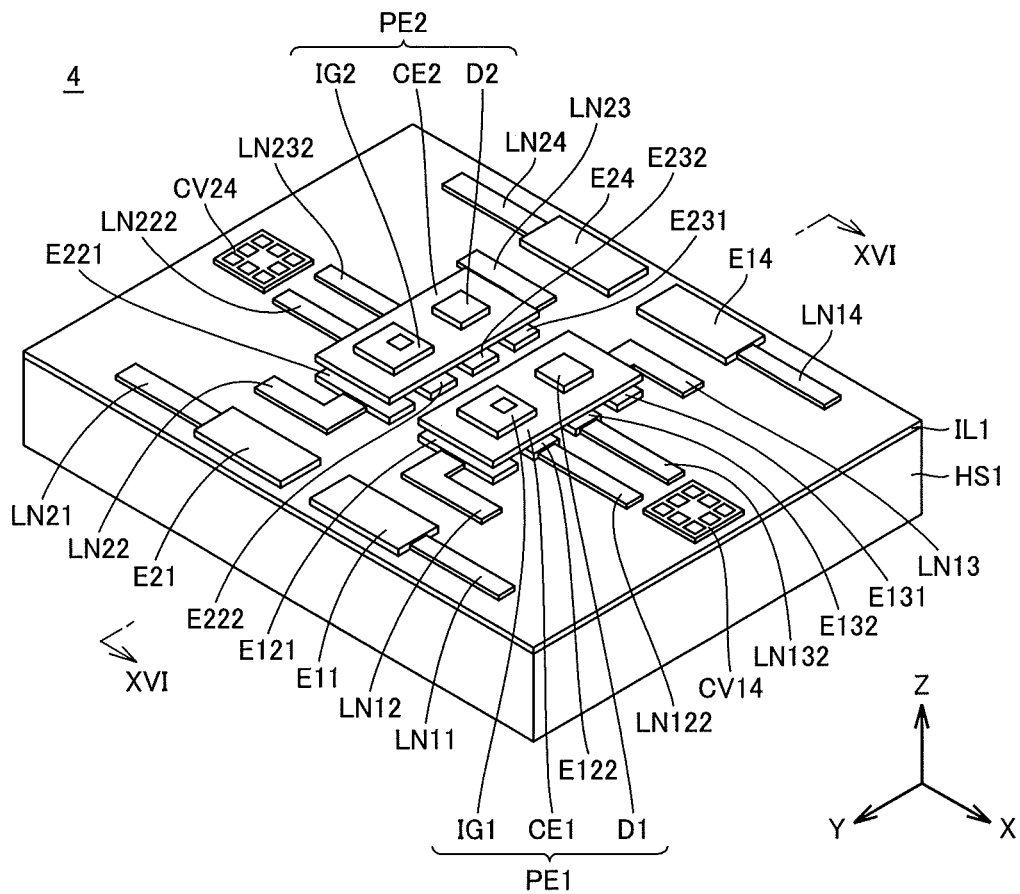
FIG. 15 is an external perspective view of a power module, which is one example of an electronic module according to Embodiment 4.
Figure 16:
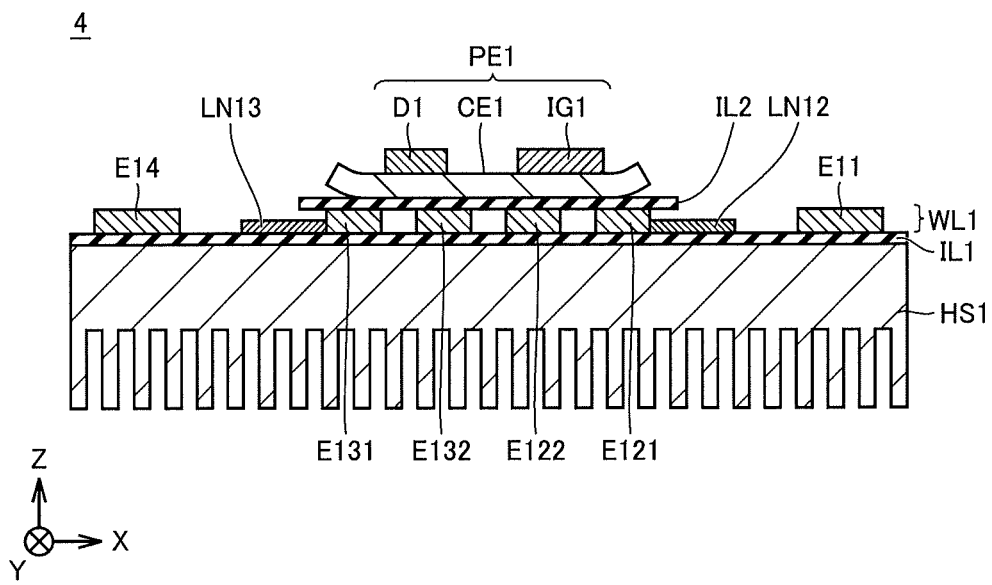
FIG. 16 is a cross section of the power module viewed from XVI-XVI line of FIG. 15.

FIG. 15 is an external perspective view of a power module 4, which is one example of an electronic module according to Embodiment 4. FIG. 16 is a cross section of power module 4 viewed from XVI-XVI line of FIG. 15. Power module 4 shown in FIGS. 15 and 16 does not include insulating layer IL3, electrodes E15, E16, E25, E26, and lead lines LN15, LN16, LN25, LN26 from the configuration of power module 1 shown in FIGS. 1 and 2. In power module 4, electrodes E121, E122, E131, E132 are disposed, instead of electrodes E12 and E13 included in power module 1. In power module 4, electrodes E221, E222, E231, E232 are disposed, instead of electrodes E22 and E23 included in power module 1. Power module 4 includes lead lines LN122, LN132, LN222, LN232, in addition to the configuration of power module 1. In power module 4, capacitance-to-voltage converters CV11, CV21 in FIG. 1 are replaced with capacitance-to-voltage converters CV14, CV24, respectively.

Power elements PE1, PE2 are disposed on insulating layer IL2. Capacitance-to-voltage converters CV14 and CV24 have the same circuit structure.

Electrodes E122, E132 are disposed between electrodes E121 and E131 in X-axis direction. Electrodes E121, E122, E132, E131 are linearly disposed in the listed order in X-axis direction. Electrodes E121, E122, E132, E131 are connected to lead lines LN12, LN122, LN132, LN13, respectively. Lead lines LN12, LN122, LN132, LN13 are connected to capacitance-to-voltage converter CV14 through wiring not shown.

Electrodes E222, E232 are disposed between electrodes E221 and E231 in X-axis direction. Electrodes E221, E222, E232, E231 are linearly disposed in the listed order in X-axis direction. Electrodes E221, E222, E232, E231 are connected to lead lines LN22, LN222, LN232, LN23, respectively. Lead lines LN22, LN222, LN232, LN23 are connected to capacitance-to-voltage converter CV24 through wiring not shown.

Referring to FIG. 16, electrodes E121, E122, E132, E131 are opposed to common collector electrode CE1 via insulating layer IL2. A capacitance is formed between electrode E121 and a portion of common collector electrode CE1 opposite the electrode E121. A capacitance is formed between electrode E122 and a portion of common collector electrode CE1 opposite the electrode E122. A capacitance is formed between electrode E132 and a portion of common collector electrode CE1 opposite the electrode E132. A capacitance is formed between electrode E131 and a portion of common collector electrode CE1 opposite the electrode E131.

Figure 17:
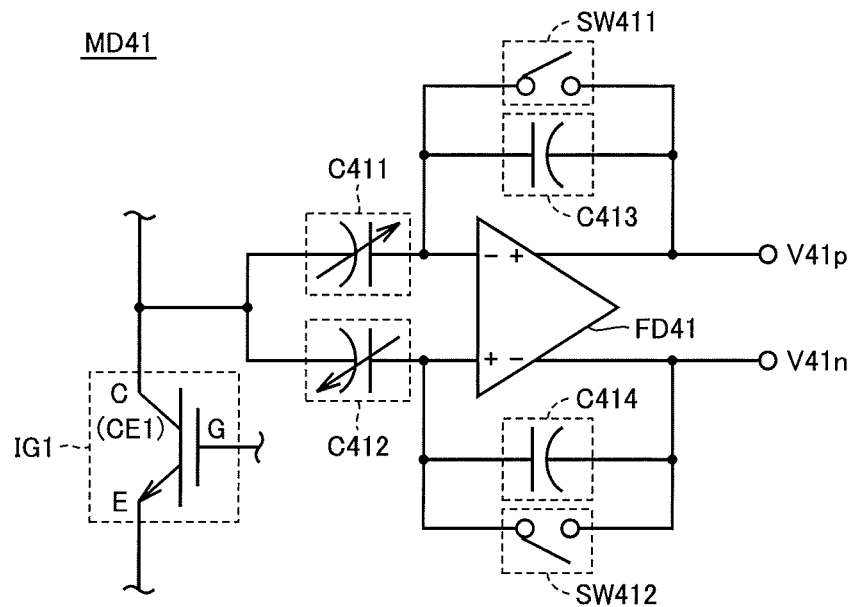
FIG. 17 is a circuit diagram of a fault sensing circuit for sensing the peeling of one end of a common collector electrode in X-axis direction from an insulating layer, shown in FIG. 16.

FIG. 17 is a circuit diagram of a fault sensing circuit MD41 for sensing peeling of one end of common collector electrode CE1 from insulating layer IL2 in X-axis direction shown in FIG. 16. As shown in FIG. 17, fault sensing circuit MD41 includes variable capacitors C411, C412, a fully-differential amplifier FD41, capacitors C413, C414, and switches SW411, SW412.

Variable capacitor C411 is connected between a collector electrode of a semiconductor switch IG1 and an inverting input terminal of fully-differential amplifier FD41. Variable capacitor C412 is connected between the collector electrode of semiconductor switch IG1 and a non-inverting input terminal of fully-differential amplifier FD41.

Capacitor C413 is connected between the inverting input terminal and an output terminal V41p of fully-differential amplifier FD41. Switch SW411 is connected in parallel with capacitor C413, between the inverting input terminal and output terminal V41p of fully-differential amplifier FD41. Switch SW411 changes, at any time, to a conductive state, which resets electric charge stored at capacitor C413. Switch SW411 may periodically change to the conductive state based on a clock signal to reset the electric charge stored at capacitor C413.

Capacitor C414 is connected between the non-inverting input terminal and output terminal V41n of fully-differential amplifier FD41. Switch SW412 is connected in parallel with capacitor C414, between the non-inverting input terminal and output terminal V41n of fully-differential amplifier FD41. Switch SW412 changes, at any time, to a conductive state, which resets electric charge stored at capacitor C414. Switch SW412 may periodically change to the conductive state based on a clock signal to reset the electric charge stored at capacitor C414.

Referring to FIGS. 16 and 17, variable capacitor C411 corresponds to a capacitance formed between electrode E121 and a portion of common collector electrode CE1 opposite the electrode E121. Electrode E121 is connected to the inverting input terminal of fully-differential amplifier FD41. Variable capacitor C412 corresponds to a capacitance formed between electrode E122 and a portion of common collector electrode CE1 opposite the electrode E122. Electrode E122 is connected to the non-inverting input terminal of fully-differential amplifier FD41.

Figure 18:
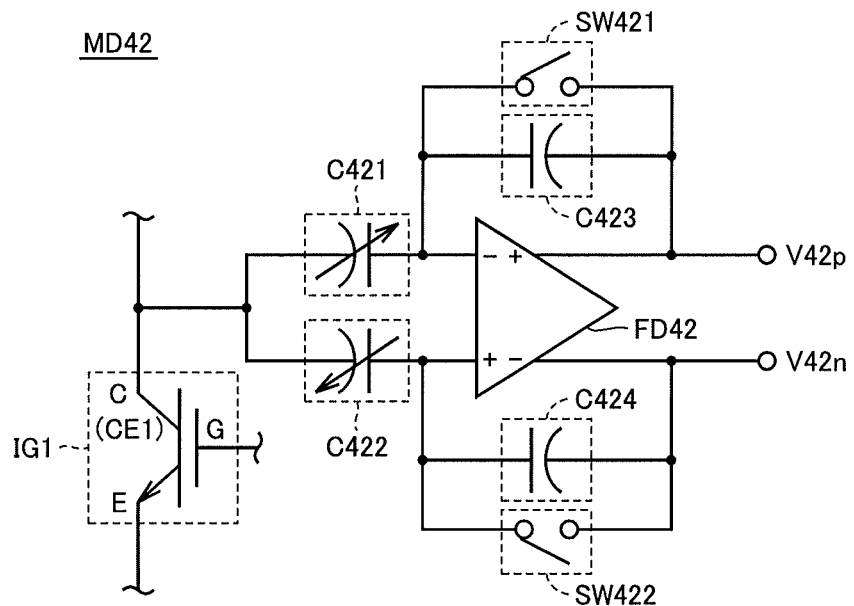
FIG. 18 is a circuit diagram of the fault sensing circuit for sensing the peeling of the other end of the common collector electrode in X-axis direction from the insulating layer, shown in FIG. 16.

FIG. 18 is a circuit diagram of a fault sensing circuit MD42 for sensing the peeling of the other end of common collector electrode CE1 from insulating layer IL2 in X-axis direction, shown in FIG. 16. As shown in FIG. 18, fault sensing circuit MD42 includes variable capacitors C421, C422, a fully-differential amplifier FD42, capacitors C423, C424, and switches SW421, SW422.

Variable capacitor C421 is connected between a collector electrode of semiconductor switch IG1 and an inverting input terminal of fully-differential amplifier FD42. Variable capacitor C422 is connected between the collector electrode of semiconductor switch IG1 and a non-inverting input terminal of fully-differential amplifier FD42.

Capacitor C423 is connected between the inverting input terminal and an output terminal V42p of fully-differential amplifier FD42. Switch SW421 is connected in parallel with capacitor C423, between the inverting input terminal and output terminal V42p of fully-differential amplifier FD42.

Switch SW421 changes, at any time, to a conductive state, which resets electric charge stored at capacitor C423. Switch SW421 may periodically change to the conductive state based on a clock signal to reset the electric charge stored at capacitor C423.

Capacitor C424 is connected between the non-inverting input terminal and output terminal V42n of fully-differential amplifier FD42. Switch SW422 is connected in parallel with capacitor C424, between the non-inverting input terminal and output terminal V42n of fully-differential amplifier FD42. Switch SW422 changes, at any time, to a conductive state, which resets electric charge stored at capacitor C424. Switch SW422 may periodically change to the conductive state based on a clock signal to reset the electric charge stored at capacitor C424.

Referring to FIGS. 16 and 18, variable capacitor C421 corresponds to a capacitance formed between electrode E131 and a portion of common collector electrode CE1 opposite the electrode E131. Electrode E131 is connected to the inverting input terminal of fully-differential amplifier FD42. Variable capacitor C422 corresponds to a capacitance formed between electrode E132 and a portion of common collector electrode CE1 opposite the electrode E132. Electrode E132 is connected to the non-inverting input terminal of fully-differential amplifier FD42.

Fully-differential amplifier FD41, capacitors C413, C414, and switches SW411, SW412, shown in FIG. 17, are implemented in capacitance-to-voltage converter CV14 shown in FIG. 15. Fully-differential amplifier FD42, capacitors C423, C424, and switches SW421, SW422, shown in FIG. 18, are implemented in capacitance-to-voltage converter CV14. A fault sensing circuit MD2 for sensing the peeling of insulating layer IL1 from heat sink substrate HS1, shown in FIG. 8, is formed in power module 4.

As described above, according to the electronic module of Embodiment 4, peeling of the specified substrate from the insulating layer and vice versa can be sensed by referring to a voltage output from the capacitance-to-voltage converter. Moreover, according to the electronic module of Embodiment 4, use of the fully-differential amplifier allows for highly accurately sensing the peeling of the specified substrate from the insulating layer and vice versa, as compared to when a single differential amplifier is used. According to the electronic module of Embodiment 4, the peeling of each of two specified conductors can be sensed. According to the electronic module of Embodiment 4, the manufacturing cost can be reduced and size reduction and profile reduction can be achieved, as compared to the electronic module according to Embodiment 1. Furthermore, according to the electronic module of Embodiment 4, even the peeling of both sides of a specified conductor to a similar extent can be sensed.

Embodiment 5

Figure 19:
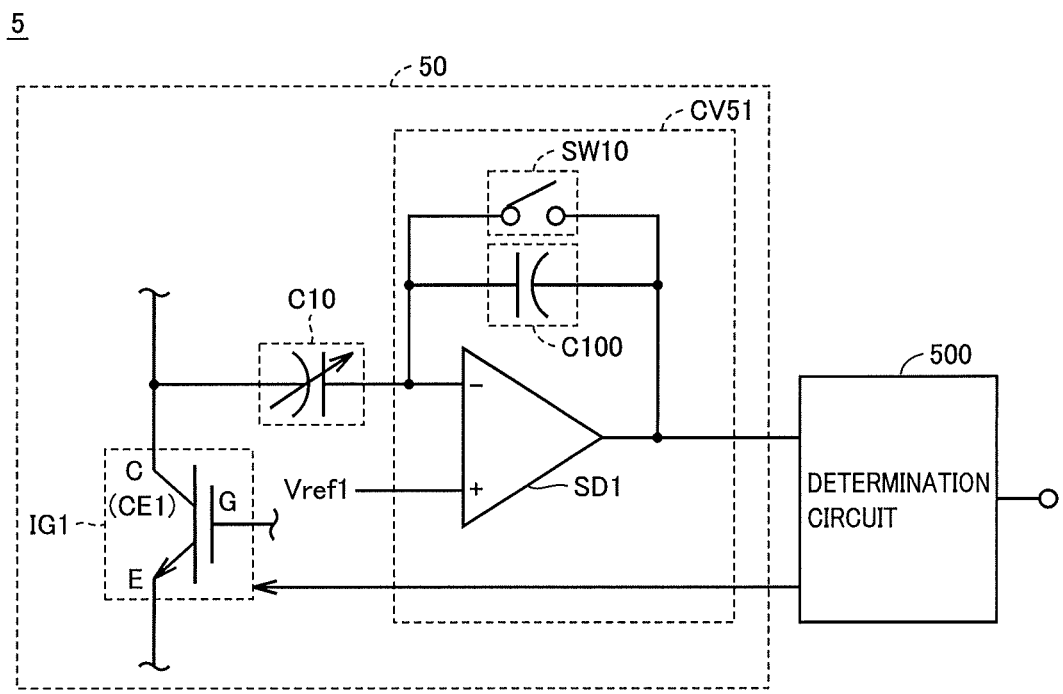
FIG. 19 is a functional block diagram showing a functional configuration of a power module according to Embodiment 5.

In Embodiment 5, a power module employing the electronic module according to Embodiments 1 to 4 will be described. FIG. 19 is a functional block diagram showing a functional configuration of a power module 5 according to Embodiment 5. As shown in FIG. 19, power module 5 includes an electronic module 50 and a determination circuit 500.

The circuit structure of electronic module 50 is the same as fault sensing circuit MD10 shown in FIG. 6. Switch SW10, capacitor C10, and differential amplifier SD1 are implemented in capacitance-to-voltage converter CV51. The circuit structure of electronic module 50 may include the circuit structures shown in FIGS. 7, 8, 13, 17, and 18.

Determination circuit 500 receives an output voltage of capacitance-to-voltage converter CV51 to determine a state of electronic module 50. If electronic module 50 is in an abnormal state, determination circuit 500 outputs a stop signal to a semiconductor switch IG1 to stop electronic module 50.

Figure 20:
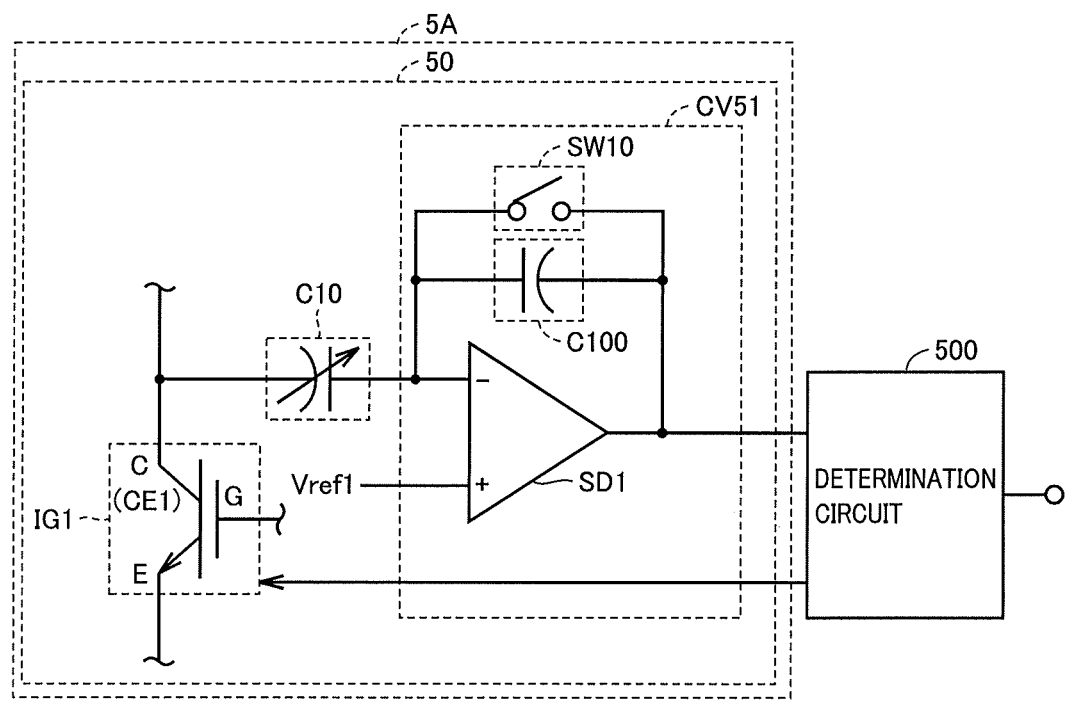
FIG. 20 is a diagram showing a functional configuration of a power module according to a variation of Embodiment 5 and an external determination circuit.

Embodiment 5 has been described with reference to the determination circuit being included in the power module. The determination circuit may not be included in the power module. FIG. 20 is a diagram showing a functional configuration of a power module 5A according to a variation of Embodiment 5, and an external determination circuit 500. As shown in FIG. 20, determination circuit 500 may be provided external to power module 5A.

As described above, according to the power module of Embodiment 5, deterioration of the electronic module can be determined by sensing the peeling of the specified substrate from the insulating layer and vice versa by referring to a voltage output from the capacitance-to-voltage converter.

The presently disclosed embodiments are also expected to be combined and implemented as appropriate within a consistent range. The presently disclosed embodiments should be considered in all aspects as illustrative and not restrictive. The scope of the present invention is defined by the appended claims, rather than by the description above. All changes which come within the meaning and range of equivalency of the appended claims are to be embraced within their scope.

REFERENCE SIGNS LIST 1, 2, 3, 4, 5, 5A power module; 10 stack; 50 electronic module; 500 determination circuit; C1 to C3, C10, C13, C14, C23, C24, C33, C34, C100, C413, C414, C423, C424 capacitor; C11, C12, C21, C22, C31, C32, C411, C412, C421, C422 variable capacitor; CE1, CE2 common collector electrode; CV10, CV11, CV13, CV14, CV21, CV23, CV24, CV51 capacitance-to-voltage converter; D1, D2 diode; E1, E2, E11 to E16, E21 to E26, E121, E122, E131, E132, E221, E222, E231, E232 electrode; FD1 to FD3, FD41, FD42 fully-differential amplifier; HS1 heat sink substrate; IG1, IG2 semiconductor switch; IL1 to IL3, IL10 insulating layer; LN11 to LN16, LN21 to LN26, LN122, LN132, LN222, LN232 lead line; MD1, MD2, MD3, MD10, MD41, MD42 fault sensing circuit; PE1, PE2 power element; SD1 differential amplifier; SW10, SW11, SW12, SW21, SW22, SW31, SW32, SW411, SW412, SW421, SW422 switch; V1n, V1p, V2n, V2p, V3p, V3n, V41p, V41n, V42p, V42n, Vout output terminal; and WL1, WL2 wiring layer.

The invention claimed is:

1. An electronic module, comprising:
a first specified conductor;
a first insulating layer;
a first wiring layer which includes a first sense electrode;
a second insulating layer;
a second wiring layer including a first capacitor electrode and a second capacitor electrode; and
a capacitance-to-voltage converter connected to the first sense electrode,
the first sense electrode being opposed to a first portion of the first specified conductor via the first insulating layer, and forming a first capacitance with the first portion,
the capacitance-to-voltage converter being configured to output a voltage according to the first capacitance, wherein the capacitance-to-voltage converter includes:
a first differential amplifier having a first input terminal, a second input terminal, and a first output terminal, the first differential amplifier being configured to output to the first output terminal a voltage difference between the first input terminal and the second input terminal; and
a first capacitor connected between the first input terminal and the first output terminal, wherein
the first wiring layer is connected to the first input terminal, wherein
the first wiring layer further includes a second sense electrode,
the first sense electrode is connected to the first input terminal,
the second sense electrode is connected to the second input terminal, the second sense electrode being opposed to a second portion of the first specified conductor via the first insulating layer, and forms a capacitance with the second portion,
the first differential amplifier further includes a second output terminal, the first differential amplifier being configured to output to the first output terminal the voltage difference as a first signal, and output to the second output terminal the voltage difference as a second signal which is in anti-phase with the first signal, and
the capacitance-to-voltage converter further includes a second capacitor connected between the second input terminal and the second output terminal, wherein
the first capacitor electrode forms the first capacitor with the first sense electrode via the second insulating layer, the first capacitor electrode being connected to the first output terminal, and
the second capacitor electrode forms the second capacitor with the second sense electrode via the second insulating layer, the second capacitor electrode being connected to the second output terminal.

2. The electronic module according to claim 1, wherein the capacitance-to-voltage converter further includes: a first switch connected in parallel with the first capacitor, between the first input terminal and the first output terminal; and a second switch connected in parallel with the second capacitor, between the second input terminal and the second output terminal.

3. An electronic module comprising:
a first specified conductor;
a first insulating layer;
a first wiring layer which includes a first sense electrode;
a second specified conductor;
a second insulating layer;
a second wiring layer including a third sense electrode and a fourth sense electrode; and
a capacitance-to-voltage converter connected to the first sense electrode,
the first sense electrode being opposed to a first portion of the first specified conductor via the first insulating layer, and forming a first capacitance with the first sense electrode,
the capacitance-to-voltage converter being configured to output a voltage according to the first capacitance, wherein
the capacitance-to-voltage converter includes:
a first differential amplifier having a first input terminal, a second input terminal, and a first output terminal, the first differential amplifier being configured to output to the first output terminal a voltage difference between the first input terminal and the second input terminal; and
a first capacitor connected between the first input terminal and the first output terminal, wherein
the first wiring layer is connected to the first input terminal, wherein
the first wiring layer further includes a second sense electrode,
the first sense electrode is connected to the first input terminal,
the second sense electrode is connected to the second input terminal, the second sense electrode being opposed to a second portion of the first specified conductor via the first insulating layer, and forms a capacitance with the second portion,
the first differential amplifier further includes a second output terminal, the first differential amplifier being configured to output to the first output terminal the voltage difference as a first signal, and output to the second output terminal the voltage difference as a second signal which is in anti-phase with the first signal, and
the capacitance-to-voltage converter further includes a second capacitor connected between the second input terminal and the second output terminal, wherein
the capacitance-to-voltage converter further includes:
a second differential amplifier having a third input terminal, a fourth input terminal, a third output terminal, and a fourth output terminal, the second differential amplifier being configured to output to the third output terminal a voltage difference between the third input terminal and the fourth input terminal as a third signal, and output to the fourth output terminal the voltage difference between the third input terminal and the fourth input terminal as a fourth signal that is in anti-phase with the third signal;
a third capacitor connected between the third input terminal and the third output terminal; and
a fourth capacitor connected between the fourth input terminal and the fourth output terminal, wherein
the third sense electrode is connected to the third input terminal, the third sense electrode being opposed to a third portion of the second specified conductor via the second insulating layer, and forms a third capacitance with the third portion, and
the fourth sense electrode is connected to the fourth input terminal, the fourth sense electrode being opposed to a fourth portion of the second specified conductor via the second insulating layer, and forms a fourth capacitance with the fourth portion.

4. The electronic module according to claim 3, wherein the capacitance-to-voltage converter further includes:
a third switch connected in parallel with the third capacitor, between the third input terminal and the third output terminal; and
a fourth switch connected in parallel with the fourth capacitor, between the fourth input terminal and the fourth output terminal.

5. A power module, comprising:
the electronic module according to claim 1; and
a determination circuit configured to receive the voltage from the capacitance-to-voltage converter to determine a state of the electronic module, wherein
the determination circuit stops the electronic module when the state of the electronic module is abnormal.

6. A power module, comprising:
the electronic module according to claim 1, wherein
the capacitance-to-voltage converter outputs the voltage to an external determination circuit, and
the determination circuit receives the voltage to determine a state of the electronic module, and stops the electronic module when the state of the electronic module is abnormal.

\* \* \* \* \*